US009417332B2

(12) United States Patent
Bouton et al.

(10) Patent No.: US 9,417,332 B2
(45) Date of Patent: Aug. 16, 2016

(54) RADIOPHARMACEUTICAL CZT SENSOR AND APPARATUS

(75) Inventors: Chad E. Bouton, Powell, OH (US); Mehmet Husnu, Phoenix, AZ (US)

(73) Assignee: Cardinal Health 414, LLC, Dublin, OH (US)

( * ) Notice: Subject to any disclaimer, the term of this patent is extended or adjusted under 35 U.S.C. 154(b) by 463 days.

(21) Appl. No.: 13/550,282

(22) Filed: Jul. 16, 2012

(65) Prior Publication Data

US 2013/0015361 A1 Jan. 17, 2013

Related U.S. Application Data

(60) Provisional application No. 61/508,402, filed on Jul. 15, 2011, provisional application No. 61/508,294, filed on Jul. 15, 2011.

(51) Int. Cl.
*G01T 1/24* (2006.01)
*G01T 1/164* (2006.01)
*H01L 31/0296* (2006.01)
*G01T 1/29* (2006.01)

(52) U.S. Cl.
CPC .............. *G01T 1/1648* (2013.01); *G01T 1/249* (2013.01); *G01T 1/24* (2013.01); *G01T 1/241* (2013.01); *G01T 1/2928* (2013.01); *H01L 31/0296* (2013.01)

(58) Field of Classification Search
CPC ......... G01T 1/24; G01T 1/249; G01T 1/2928; H01L 31/0296
USPC ................................................... 250/370.13
See application file for complete search history.

(56) References Cited

U.S. PATENT DOCUMENTS

| 3,959,172 | A |   | 5/1976  | Brownell et al. |
|-----------|---|---|---------|-----------------|
| 4,754,786 | A |   | 7/1988  | Roberts |
| 4,777,367 | A | * | 10/1988 | Kawasaki et al. ........ 250/336.1 |
| 4,794,178 | A |   | 12/1988 | Coenen et al. |
| 4,866,277 | A | * | 9/1989  | Johnson et al. ........ 250/385.1 |
| 4,967,811 | A |   | 11/1990 | DiGianfilippo et al. |
| 5,029,479 | A |   | 7/1991  | Bryan |
| 5,139,731 | A |   | 8/1992  | Hendry |

(Continued)

FOREIGN PATENT DOCUMENTS

| CN | 101603929 A | * | 12/2009 |
|----|-------------|---|---------|
| EP | 2059443 B1  |   | 11/2010 |

(Continued)

OTHER PUBLICATIONS

International Search Report dated Sep. 7, 2012.

(Continued)

*Primary Examiner* — Christine Sung
(74) *Attorney, Agent, or Firm* — Amanda F. Maharaj

(57) ABSTRACT

A gamma ray detector includes a gamma ray detecting rod elongated along a longitudinal axis, wherein gamma ray detection is enhanced along the longitudinal axis, and a gamma ray shield encapsulating the rod, the shield having an aperture at an end of the detecting rod along the longitudinal axis to admit gamma rays substantially parallel to the longitudinal axis of the elongated detecting rod, wherein gamma ray detection is enhanced along the longitudinal axis and aperture to substantially collimate the sensitivity of the gamma ray detector along the combined aperture and longitudinal axis of the detecting rod.

11 Claims, 8 Drawing Sheets

(56) References Cited

U.S. PATENT DOCUMENTS

| | | | | |
|---|---|---|---|---|
| 5,171,132 | A | 12/1992 | Miyazaki et al. | |
| 5,211,678 | A | 5/1993 | Stephenson et al. | |
| 5,330,142 | A * | 7/1994 | Gnau, III | 248/124.1 |
| 5,356,378 | A | 10/1994 | Doan | |
| 5,373,844 | A | 12/1994 | Smith et al. | |
| 5,428,470 | A | 6/1995 | Labriola, II | |
| 5,429,133 | A | 7/1995 | Thurston et al. | |
| 5,519,635 | A | 5/1996 | Miyake et al. | |
| 5,527,473 | A | 6/1996 | Ackerman | |
| 5,540,081 | A | 7/1996 | Takeda et al. | |
| 5,580,523 | A | 12/1996 | Bard | |
| 5,605,251 | A | 2/1997 | Retti | |
| 5,626,172 | A | 5/1997 | Schumacher et al. | |
| 5,648,268 | A | 7/1997 | Batchelder et al. | |
| 5,659,171 | A | 8/1997 | Young et al. | |
| 5,800,784 | A | 9/1998 | Horn | |
| 5,866,907 | A * | 2/1999 | Drukier et al. | 250/366 |
| 5,911,252 | A | 6/1999 | Cassel | |
| 5,932,178 | A | 8/1999 | Yamazaki et al. | |
| 5,937,364 | A | 8/1999 | Westgard et al. | |
| 5,961,458 | A * | 10/1999 | Carroll | 600/436 |
| 6,021,341 | A * | 2/2000 | Scibilia et al. | 600/407 |
| 6,135,955 | A * | 10/2000 | Madden et al. | 600/436 |
| 6,172,207 | B1 | 1/2001 | Damhaut et al. | |
| 6,227,809 | B1 | 5/2001 | Forster et al. | |
| 6,236,880 | B1 * | 5/2001 | Raylman et al. | 600/436 |
| 6,359,952 | B1 | 3/2002 | Alvord | |
| 6,407,394 | B1 * | 6/2002 | Borioli et al. | 250/395 |
| 6,484,050 | B1 * | 11/2002 | Carroll et al. | 600/436 |
| 6,531,705 | B2 | 3/2003 | White et al. | |
| 6,559,440 | B2 * | 5/2003 | Yarnall et al. | 250/252.1 |
| 6,565,815 | B1 | 5/2003 | Yuan et al. | |
| 6,567,492 | B2 | 5/2003 | Kiselev et al. | |
| 6,599,484 | B1 | 7/2003 | Zigler et al. | |
| 6,624,425 | B2 * | 9/2003 | Nisius et al. | 250/393 |
| 6,643,538 | B1 | 11/2003 | Majewski et al. | |
| 6,644,944 | B2 | 11/2003 | Karp | |
| 6,658,946 | B2 | 12/2003 | Lipscomb et al. | |
| 6,771,802 | B1 * | 8/2004 | Patt et al. | 382/128 |
| 6,787,786 | B2 | 9/2004 | Kalas et al. | |
| 6,827,095 | B2 | 12/2004 | O'Connor et al. | |
| 6,828,143 | B1 | 12/2004 | Bard | |
| 6,845,137 | B2 | 1/2005 | Ruth et al. | |
| 6,915,823 | B2 | 7/2005 | Osborne et al. | |
| 6,917,044 | B2 | 7/2005 | Amini | |
| 6,986,649 | B2 | 1/2006 | Dai et al. | |
| 6,991,214 | B2 | 1/2006 | Richter | |
| 7,018,614 | B2 | 3/2006 | Kiselev et al. | |
| 7,025,323 | B2 | 4/2006 | Krulevitch et al. | |
| 7,030,399 | B2 | 4/2006 | Williamson et al. | |
| 7,056,477 | B1 | 6/2006 | Schwalbe et al. | |
| 7,104,768 | B2 | 9/2006 | Richter et al. | |
| 7,118,917 | B2 | 10/2006 | Bergh et al. | |
| 7,127,023 | B2 | 10/2006 | Wieland | |
| 7,170,072 | B2 | 1/2007 | Schwarz et al. | |
| 7,172,735 | B1 | 2/2007 | Lowe et al. | |
| 7,200,198 | B2 | 4/2007 | Wieland et al. | |
| 7,206,715 | B2 | 4/2007 | Vanderveen et al. | |
| 7,235,216 | B2 | 6/2007 | Kiselev et al. | |
| 7,279,676 | B2 * | 10/2007 | Twomey | 250/252.1 |
| 7,347,617 | B2 | 3/2008 | Pugia et al. | |
| 7,378,659 | B2 | 5/2008 | Burr et al. | |
| 7,418,981 | B2 | 9/2008 | Baker et al. | |
| 7,419,653 | B2 | 9/2008 | Walsh et al. | |
| 7,435,392 | B2 | 10/2008 | Oberbeck et al. | |
| 7,445,650 | B2 | 11/2008 | Weil et al. | |
| 7,445,926 | B2 | 11/2008 | Mathies et al. | |
| 7,468,165 | B2 | 12/2008 | Oberbeck et al. | |
| 7,476,883 | B2 | 1/2009 | Nutt | |
| 7,485,454 | B1 | 2/2009 | Jury et al. | |
| 7,512,206 | B2 | 3/2009 | Wieland | |
| 7,577,228 | B2 | 8/2009 | Jackson | |
| 7,586,102 | B2 | 9/2009 | Mourtada et al. | |
| 7,607,641 | B1 | 10/2009 | Yuan | |
| 7,622,509 | B2 | 11/2009 | Tonkovich et al. | |
| 7,624,642 | B2 | 12/2009 | Romo | |
| 7,634,378 | B2 | 12/2009 | Kaplit | |
| 7,638,059 | B2 | 12/2009 | Kim et al. | |
| 7,641,860 | B2 | 1/2010 | Matteo | |
| 7,659,522 | B2 | 2/2010 | Kim et al. | |
| 7,766,883 | B2 | 8/2010 | Reilly et al. | |
| 7,829,032 | B2 | 11/2010 | Van Dam et al. | |
| 7,832,429 | B2 | 11/2010 | Young et al. | |
| 7,863,035 | B2 | 1/2011 | Clemens et al. | |
| 7,917,313 | B2 | 3/2011 | Ziegler et al. | |
| 7,987,726 | B2 | 8/2011 | Dannhauer | |
| 2001/0055812 | A1 | 12/2001 | Mian et al. | |
| 2002/0043638 | A1 | 4/2002 | Kao et al. | |
| 2002/0048536 | A1 | 4/2002 | Bergh et al. | |
| 2002/0128734 | A1 | 9/2002 | Dorsett | |
| 2002/0148957 | A1 | 10/2002 | Lingren et al. | |
| 2003/0007588 | A1 | 1/2003 | Kiselev et al. | |
| 2003/0034456 | A1 | 2/2003 | McGregor | |
| 2003/0057381 | A1 | 3/2003 | Hirayanagi | |
| 2003/0057391 | A1 | 3/2003 | Krulevitch et al. | |
| 2003/0175947 | A1 | 9/2003 | Liu et al. | |
| 2003/0194039 | A1 | 10/2003 | Kiselev et al. | |
| 2004/0022696 | A1 | 2/2004 | Zigler et al. | |
| 2004/0028573 | A1 | 2/2004 | Schmitz et al. | |
| 2004/0037739 | A1 | 2/2004 | McNeely et al. | |
| 2004/0054248 | A1 | 3/2004 | Kimchy et al. | |
| 2004/0084340 | A1 | 5/2004 | Morelle et al. | |
| 2004/0120836 | A1 | 6/2004 | Dai et al. | |
| 2004/0136878 | A1 | 7/2004 | Meier et al. | |
| 2004/0209354 | A1 | 10/2004 | Mathies et al. | |
| 2004/0258615 | A1 | 12/2004 | Buchanan et al. | |
| 2004/0262158 | A1 | 12/2004 | Alvord et al. | |
| 2005/0072946 | A1 | 4/2005 | Studer et al. | |
| 2005/0084055 | A1 | 4/2005 | Alvord et al. | |
| 2005/0147535 | A1 | 7/2005 | Shulman et al. | |
| 2005/0191184 | A1 | 9/2005 | Vinson | |
| 2005/0232387 | A1 | 10/2005 | Padgett et al. | |
| 2005/0232861 | A1 | 10/2005 | Buchanan et al. | |
| 2005/0260130 | A1 | 11/2005 | Elmaleh et al. | |
| 2006/0004491 | A1 | 1/2006 | Welch et al. | |
| 2006/0076068 | A1 | 4/2006 | Young et al. | |
| 2006/0132068 | A1 | 6/2006 | Norling et al. | |
| 2006/0150385 | A1 | 7/2006 | Gilligan et al. | |
| 2006/0231519 | A1 | 10/2006 | Py et al. | |
| 2006/0263293 | A1 | 11/2006 | Kolb et al. | |
| 2007/0027637 | A1 | 2/2007 | Delenstarr et al. | |
| 2007/0048217 | A1 | 3/2007 | McBride et al. | |
| 2007/0217561 | A1 | 9/2007 | Wieland et al. | |
| 2007/0217963 | A1 | 9/2007 | Elizarov et al. | |
| 2008/0050283 | A1 | 2/2008 | Chou et al. | |
| 2008/0064110 | A1 | 3/2008 | Elizarov et al. | |
| 2008/0122390 | A1 | 5/2008 | Lidestri | |
| 2008/0123808 | A1 * | 5/2008 | Caffrey | 378/57 |
| 2008/0171999 | A1 | 7/2008 | Baplue et al. | |
| 2008/0172024 | A1 | 7/2008 | Yow | |
| 2008/0177126 | A1 | 7/2008 | Tate et al. | |
| 2008/0181829 | A1 | 7/2008 | Matteo | |
| 2008/0233018 | A1 | 9/2008 | Van Dam et al. | |
| 2008/0233653 | A1 | 9/2008 | Hess et al. | |
| 2008/0249510 | A1 | 10/2008 | Mescher et al. | |
| 2008/0277591 | A1 | 11/2008 | Shahar et al. | |
| 2008/0281090 | A1 | 11/2008 | Lee et al. | |
| 2009/0005617 | A1 | 1/2009 | Maeding et al. | |
| 2009/0036668 | A1 | 2/2009 | Elizarov et al. | |
| 2009/0056822 | A1 | 3/2009 | Young et al. | |
| 2009/0056861 | A1 | 3/2009 | Young et al. | |
| 2009/0094940 | A1 | 4/2009 | Py | |
| 2009/0095635 | A1 | 4/2009 | Elizarov et al. | |
| 2009/0139310 | A1 | 6/2009 | Santiago et al. | |
| 2009/0157040 | A1 | 6/2009 | Jacobson et al. | |
| 2009/0159807 | A1 | 6/2009 | Waller | |
| 2009/0165477 | A1 | 7/2009 | Sturken et al. | |
| 2009/0181411 | A1 | 7/2009 | Battrell et al. | |
| 2009/0185955 | A1 | 7/2009 | Nellissen | |
| 2009/0218520 | A1 | 9/2009 | Nutt | |
| 2009/0247417 | A1 | 10/2009 | Haas et al. | |
| 2009/0288497 | A1 | 11/2009 | Ziegler et al. | |
| 2009/0305431 | A1 | 12/2009 | Hodges et al. | |
| 2009/0314365 | A1 | 12/2009 | McAvoy et al. | |

(56) References Cited

U.S. PATENT DOCUMENTS

| | | |
|---|---|---|
| 2009/0314972 A1 | 12/2009 | McAvoy et al. |
| 2010/0008834 A1 | 1/2010 | Lohf et al. |
| 2010/0101783 A1 | 4/2010 | Vinegar et al. |
| 2010/0145630 A1 | 6/2010 | Ball et al. |
| 2010/0187452 A1 | 7/2010 | Mukaddam et al. |
| 2010/0217011 A1 | 8/2010 | Dinkelborg et al. |
| 2010/0243972 A1 | 9/2010 | Voccia et al. |
| 2010/0286512 A1 | 11/2010 | Dhawale et al. |
| 2010/0304494 A1 | 12/2010 | Tokhtuev et al. |
| 2010/0307616 A1 | 12/2010 | Liou et al. |
| 2011/0003981 A1 | 1/2011 | Hirano et al. |
| 2011/0008215 A1 | 1/2011 | Elizarov et al. |
| 2011/0041935 A1 | 2/2011 | Zhou et al. |
| 2011/0087439 A1 | 4/2011 | Ziegler et al. |
| 2011/0098465 A1 | 4/2011 | Ball et al. |
| 2011/0126911 A1 | 6/2011 | Kobrin et al. |
| 2011/0150714 A1 | 6/2011 | Elizarov et al. |
| 2011/0178359 A1 | 7/2011 | Hirschman et al. |
| 2012/0074330 A1 | 3/2012 | Bouton et al. |
| 2012/0222774 A1 | 9/2012 | Husnu et al. |
| 2013/0015361 A1 | 1/2013 | Bouton |
| 2013/0018618 A1 | 1/2013 | Eshima et al. |
| 2013/0020727 A1 | 1/2013 | Klausing et al. |
| 2013/0022525 A1 | 1/2013 | Eshima et al. |
| 2013/0023657 A1 | 1/2013 | Klausing et al. |
| 2013/0060017 A1 | 3/2013 | Eshima et al. |
| 2013/0060134 A1 | 3/2013 | Eshima et al. |
| 2013/0102772 A1 | 4/2013 | Eshima et al. |
| 2014/0229152 A1 | 8/2014 | Chisholm |
| 2014/0238542 A1 | 8/2014 | Kvale |
| 2016/0001245 A1 | 1/2016 | Klausing et al. |

FOREIGN PATENT DOCUMENTS

| | | |
|---|---|---|
| WO | WO 95/12203 A1 | 5/1995 |
| WO | WO 00/62919 A1 | 10/2000 |
| WO | WO 02/33296 A2 | 4/2002 |
| WO | WO 02/083210 A1 | 10/2002 |
| WO | WO 2005/025519 A2 | 3/2005 |
| WO | WO 2007/041486 A2 | 4/2007 |
| WO | WO 2008/028260 A2 | 3/2008 |
| WO | WO 2008/083313 A2 | 7/2008 |
| WO | WO 2008/101305 A1 | 8/2008 |
| WO | WO 2008/128306 A1 | 10/2008 |
| WO | WO 2009/003251 A1 | 1/2009 |
| WO | WO 2010/072342 A2 | 7/2010 |
| WO | WO-2012061353 A1 | 5/2012 |
| WO | WO-2013066779 A1 | 5/2013 |
| WO | WO-2014105951 A1 | 7/2014 |
| WO | WO-2014105971 A1 | 7/2014 |
| WO | WO-2015101542 A1 | 7/2015 |

OTHER PUBLICATIONS

Pacak et al. "Synthesis of 2-Deoxy-2-fluoro-D-glucose." Journal of the Chemical Society D: Chemical Communications, 1969, issue 2, p. 77.

Ido et al. "Labeled 2-deoxy-D-glucose analogs, 18F-labeled 2-deoxy-2-fluoro-D-glucose, 2-deoxy-2-fluoro-D-mannose and 14C-2-deoxy-2-fluoro-D-glucose." Journal of Labelled Compounds and Radiopharmaceuticals, 1978, vol. 14, issue 2, pp. 175-183.

Muehllehner. "Effect of Crystal Thickness on Scintillation Camera Performance." Journal of Nuclear Medicine, 1979, vol. 20, issue 9, pp. 992-994.

Gomzina et al. "Optimization of Automated Synthesis of 2-[18F] Fluoro-2-deoxy-D-glucose Involving Base Hydrolysis." Radiochemistry, 2002, vol. 44, issue 4, pp. 403-409.

GE Medical Systems Benelux s.a., "TRACERlab MX FDG," Operator manual, Technical Publications, Direction 2335255-100, Version I, Last updated: Mar. 2003, pp. 1-61.

Project Fact Sheet. Lab-on-a-chip implementation of production processes for new molecular Imaging agents.Universite De Liege. Http://cordis.europa.eu/fetch?CALLER=FP6_PROJ&ACTION=D &RCN=75854&DOC=. Last updated on Dec. 8, 2009, accessed on May 12, 2010, 2 pages.

Peng et al. "Design study of a high-resolution breast-dedicated PET system built from cadmium zinc telluride detectors." Physics in Medicine and Biology, 2010, vol. 55, issue 9, pp. 2761-2788.

Bubble column reactor. Wikipedia, last modified on Oct. 26, 2010, accessed on May 4, 2011, 1 page.

Lee W. Young, International Search Report & Written Opinion issued in Application No. PCT/US11/67650, mailed May 1, 2012, 11 pages.

Blaine R. Copenheaver, International Search Report & Written Opinion issued in Application No. PCT/US12/46910, mailed Sep. 28, 2012, 8 pages.

Lee W. Young, International Search Report & Written Opinion issued in Application No. PCT/US12/46943, mailed Sep. 28, 2012, 6 pages.

Lee W. Young, International Search Report & Written Opinion issued in Application No. PCT/US12/46968, mailed Oct. 2, 2012, 13 pages.

Vinke et al. "Thick monolithic scintillation crystals for TOF-PET with depth-of-interaction measurement." IEEE Nuclear Science Symposium Conference Record, Oct. 30, 2010-Nov. 6, 2010, pp. 1981-1984.

Blaine R. Copenheaver, Invitation to Pay Additional Fees and, Where Applicable, Protest Fee. Issued in Application No. PCT/US12/54229, mailed Nov. 2, 2012, 2 pages.

Lee W. Young, Invitation to Pay Additional Fees and, Where Applicable, Protest Fee. Issued in Application No. PCT/US12/46933, mailed Dec. 3, 2012, 2 pages.

Lee W. Young, International Search Report & Written Opinion issued in Application No. PCT/US12/46955, mailed Dec. 7, 2012, 10 pages.

Blaine R. Copenheaver, International Search Report & Written Opinion issued in Application No. PCT/US12/54229, mailed Dec. 31, 2012, 10 pages.

Lee W. Young, International Search Report & Written Opinion issued in Application No. PCT/US12/46933, mailed Feb. 11, 2013, 11 pages.

Jill Warden, International Preliminary Report on Patentability. Issued in Application No. PCT/US12/46933, mailed Jul. 18, 2014, 25 pages.

Trasis sa. "A solution for the preparation of unit doses of PET and SPECT radiopharmaceuticals." http://www.rsllabin.com/TRASIS-DISPENSER.pdf. Revision date Oct. 2009. 8 pages.

MacDonald, L.R. et al., "Effects of Detector Thickness on Geometric Sensitivity and Event Positioning Errors in the Rectangular PET/X Scanner," IEEE Transactions on Nuclear Science, 2013, vol. 60 (5), pp. 3242-3252.

Morelle J.L., et al., "Mini-fluidic chip for the total synthesis of PET tracers," TRASIS, 2009, 6 pages.

Wessmann S. et al., "Preparation of highly reactive [18F] fluoride without any evaporation step," Journal of Nuclear Medicine, 2011, vol. 52 (76), pp. 1-2.

\* cited by examiner

RADIOPHARMACEUTICAL CZT SENSOR AND APPARATUS

CROSS REFERENCE TO RELATED APPLICATIONS

This application claims priority to U.S. Provisional Patent Application No. 61/508,402 entitled "RADIOPHARMACEUTICAL CZT SENSOR AND APPARATUS" filed on Jul. 15, 2011; and U.S. Provisional Patent Application No. 61/508,294 entitled "SYSTEMS, METHODS, AND DEVICES FOR PRODUCING, MANUFACTURING, AND CONTROL OF RADIOPHARMACEUTICALS-FULL" filed on Jul. 15, 2011. The entirety of each of the preceding applications is incorporated by reference herein.

BACKGROUND

I. Field

Aspects of the present invention relate generally to gamma ray sensors, and more particularly to methods and devices for detecting radioisotope concentration, activity and volume using gamma ray detection with cadmium zinc telluride (CZT) solid state detectors.

II. Background

Diagnostic techniques in nuclear medicine generally use radioactive tracers which emit gamma rays from within the body. These tracers are generally short-lived isotopes linked to chemical compounds which permit specific physiological processes to be studied. These compounds, which incorporate radionuclides, are known as radiopharmaceuticals, and can be given by injection, inhalation or orally. One type of diagnostic technique includes detecting single photons by a gamma-ray sensitive camera which can view organs from many different angles. The camera builds an image from the points from which radiation is emitted, and the image is electronically enhanced and viewed by a physician on a monitor for indications of abnormal conditions.

A more recent development is Positron Emission Tomography (PET), which is a more precise and sophisticated technique using isotopes produced in a cyclotron, where protons are introduced into the nucleus resulting in a deficiency of neutrons (i.e., becoming proton rich).

The nucleus of a radioisotope usually becomes stable by emitting an alpha and/or beta particle (or a positron). These particles may be accompanied by the emission of energy in the form of electromagnetic radiation known as gamma rays. This process is known as radioactive decay.

A positron-emitting radionuclide is introduced into the body of a patient, usually by injection, and accumulates in the target tissue. As the radionuclide decays, a positron is emitted, and the emitted positron combines with a nearby electron in the target tissue, resulting in the simultaneous emission of two identifiable gamma rays in opposite directions, each having an energy of 511 keV. These gamma rays are conventionally detected by a PET camera, and provide a very precise indication of their origin. PET's most important clinical role is typically in oncology, with fluorine-18 (F-18) as the tracer, since F-18 has proven to be the most accurate non-invasive method of detecting and evaluating most cancers. Fluorine-18 (F-18) is one of several positron emitters (including also, Carbon-11, Nitrogen-13, and Oxygen-15) that are produced in a cyclotron and are used in PET for studying brain physiology and pathology, in particular for localizing epileptic focus, and in dementia, psychiatry and neuropharmacology studies. These positron emitters also have a significant role in cardiology. F-18 in FDG (fluorodeoxyglucose) has become very important in detection of cancers and the monitoring of progress in cancer treatment, using PET. A radioactive product such as F-18 in FDG is a specific example of a radiopharmaceutical.

F-18 has a half-life of approximately 110 minutes, which is beneficial in that it does not pose a long-term environmental and/or health hazard. For example, after 24 hours, the radioactivity level is approximately 0.01% of the product when freshly produced in a cyclotron. However, transport time from the production source to clinical use should be minimized to retain a maximum potency for accurate diagnostic value.

Whereas PET cameras are effective in imaging uptake of F-18 present in administered FDG, PET cameras are generally too large and ineffective in production settings where characterization of the source product, and not physiological response, is the goal. There is a need, therefore, for a method and apparatus to timely calibrate the radioactivity of a sample at the production source and time of production or packaging for delivery so that the level of radioactivity is predictably known at the time of use.

SUMMARY

The following presents a simplified summary of one or more aspects of a method and apparatus for detecting radioisotope concentration, activity and sample volume.

In one example aspect of the invention, a gamma ray detector may include a gamma ray detecting rod elongated in one direction to a specified length, and a gamma ray shield encapsulating the rod, the shield having an opening opposite an end of the elongated rod to admit gamma rays substantially parallel to the long axis of the elongated rod, wherein the long axis of the rod and the opening are directed toward a volume of gamma ray emitting material observable by the detector on the basis of the length of the elongated rod and the opening in the gamma ray shield.

In another example aspect of the disclosure, an apparatus for detecting a volume concentration and activity of a radionuclide content in a container includes a container of known dimensions for receiving the radionuclide. A first gamma ray detector is arranged below the container with respect to gravity and directed toward the container. A second gamma ray detector is arranged above the container with respect to gravity and opposite the first gamma ray detector, and directed toward the container. Detection circuitry and a processor are coupled to the first and second gamma ray detectors, wherein the processor is configured to measure radiation intensity received at the first and second gamma ray detectors and determine a level of content of radionuclide in the container on the basis of the radiation detected by the first and second gamma ray detectors.

To the accomplishment of the foregoing and related ends, the one or more example aspects comprise the features hereinafter fully described and particularly pointed out in the claims. The following description and the annexed drawings set forth in detail certain illustrative aspects of the one or more aspects. These aspects are indicative, however, of but a few of the various ways in which the principles of various aspects may be employed and the described aspects are intended to include all such aspects and their equivalents.

BRIEF DESCRIPTION OF THE DRAWINGS

These and other sample aspects of the invention will be described in the detailed description that follow, and in the accompanying drawings, wherein.

Figure 1:
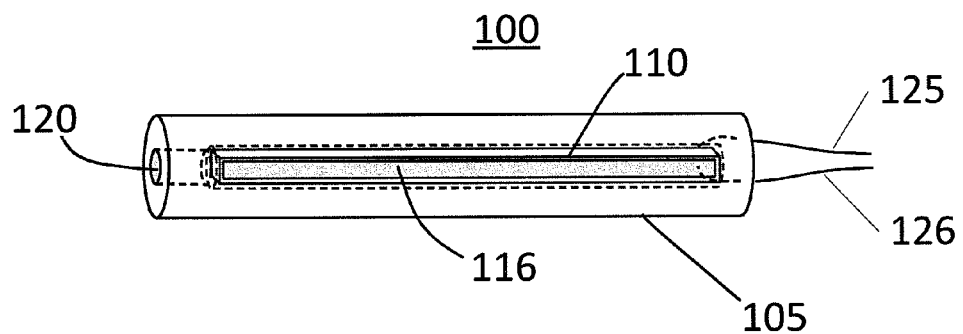
FIG. 1 is a conceptual illustration of a gamma ray collimated detector in accordance with various aspects of the invention.

In accordance with common practice, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Various aspects of methods and apparatus are described more fully hereinafter with reference to the accompanying drawings. These methods and devices may, however, be embodied in many different forms and should not be construed as limited to any specific structure or function presented throughout this disclosure. Rather, these aspects are provided so that this disclosure will be thorough and complete, and will fully convey the scope of these methods and apparatus to those skilled in the art. Based on the descriptions herein teachings herein one skilled in the art should appreciate that that the scope of the disclosure is intended to cover any aspect of the methods and apparatus disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure herein may be embodied by one or more elements of a claim.

In a radiopharmaceutical production facility, a cyclotron may be used to prepar a bolus of a material containing a radioisotope of interest which is delivered to a synthesis system. The radioisotope may emit one or more kinds of radiation, including electrons, positrons, gamma rays/x-rays, protons, neutrons, alpha particles, and other possible nuclear ejecta. In one example, a radioisotope, when added to other materials to be administered to a subject, may emit a positron, which then annihilates with an electron, for example, in human tissue, to produce gamma rays.

Aspects of the current invention describe a gamma ray detector and methods of measuring the activity, concentration, and volume of a liquid radionuclide as it fills or is drained from a container. In the production of radiopharmaceuticals, the radionuclide may be introduced into a molecular vehicle by chemical synthesis to produce the radiopharmaceutical. Various dosage, concentration, activity and volume requirements for differing medical applications may generally result in splitting, dilution and redistribution of the radioisotope for the production of the various radiopharmaceuticals, wherein a sensor monitors the various production processes.

FIG. 1 shows a schematic illustration of a gamma ray collimated detector 100. According to various aspects, the sensor 100 may include a cadmium zinc telluride (CdZnTe, or CZT) element 110. However, other solid state materials such as, e.g., other solid state materials, currently available or yet to be discovered may be used. CZT is a direct bandgap semiconductor and can operate in a direct-conversion (e.g., photoconductive) mode at room temperature, unlike some other materials (particularly germanium) which may require cooling, in some cases, to liquid nitrogen temperature. Advantages of CZT over germanium or other detectors include a high sensitivity for x-rays and gamma-rays that is due to the high atomic numbers and masses of Cd and Te relative to atomic numbers and masses of other detector materials currently in use, and better energy resolution than scintillator detectors. A gamma ray (photon) traversing a CZT element 110 liberates electron-hole pairs in its path. In operation and according to various aspects, a bias voltage applied across electrodes 115 (not shown in FIG. 1) and 116 on the surface of the element 110 (both shown in a side view in FIG. 2) causes charge to be swept to the electrodes 115, 116 on the surface of the CZT (electrons toward an anode, holes toward a cathode). According to various aspects, wires 125 and 126 may connect electrodes 115 and 116, respectively, to a source of the applied voltage.

According to various aspects, the sensor 100 can function accurately as a spectroscopic gamma energy sensor, particularly when the element 110 is CZT. However, geometric aspects may be considered. In conventional use of CZT as a gamma ray detector, the CZT element 110 may be a thin platelet, sometimes arranged in multiples to form arrays for imaging, generally perpendicularly to the source of gamma ray emission. Therefore, gamma rays of differing energies all traverse a detector element of substantially the same thickness. While absorption of the gamma ray may generally be less than 100% efficient, higher energy gamma rays may liberate more electron-hole pairs than lower energy gamma rays, producing a pulse of greater height. The spectrum and intensity of gamma ray energies may thus be spectroscopically determined by counting the number of pulses generated corresponding to different pulse heights.

According to various aspects, because higher energy photons may travel a greater distance in the CZT rod 110 before complete absorption, it is advantageous for the CZT rod 110 to be greater in length in a direction longitudinally (i.e., a long axis) intersecting a known source volume of radionuclide being measured. Gamma rays incident on the CZT rod off or transverse to the long axis may not be fully absorbed, and thus, the CZT rod may not be as sensitive a detector of such gamma rays as a result. Thus, according to various aspects, elongating the CZT rod in one direction introduces a degree of collimation and directional sensitivity along the extended direction.

According to various aspects, the absorption coefficient for 511 keV gamma ray absorption in CZT is $\mu=0.0153$ cm$^2$/gm. The absorption probability as a function of $\mu$, density $\rho$ ($=5.78$ gm/cm$^3$) and penetration distance h is $$P(\mu,h)=1-e^{-\mu\rho h}.$$

Therefore, the ratio of absorption in a 10 mm length of CZT to a 1 mm length is $$\frac{P(\mu, 10 \text{ mm})}{P(\mu, 1 \text{ mm})} \sim 9.613.$$

That is, the directional sensitivity for gamma ray detection of CZT at 511 keV along the 10 mm length of the detector is nearly 10 times greater than in the 1 mm thick transverse direction.

Figure 2:
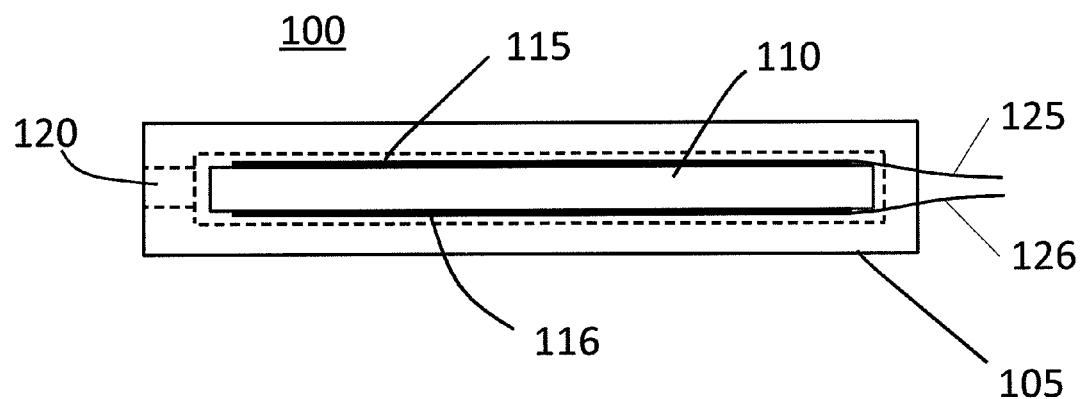
FIG. 2 is a conceptual side illustration of the detector of FIG. 1, in accordance with various aspects of the invention.

Referring to FIGS. 1 and 2, according to various aspects, the sensor may be a CZT rod 110 as described above, encased in a shielded case 105 (e.g., tungsten) with an aperture 120 open and directed toward a vial or other container containing a radiopharmaceutical sample to expose to the CZT rod 110 along the long dimension of the rod 110, while shielding the CZT rod 110 from gamma rays incident laterally to the long dimension of the rod 110, e.g., from directions other than along the longitudinal dimension. According to various aspects, the combination of shielding, aperture and extended length of the CZT detector in the direction of gamma ray emission from a portion of the radiopharmaceutical sample provides a substantial directional "virtual" collimation of the CZT detector's sensitivity to gamma rays incident from a volume of the radiopharmaceutical that is defined by the collimation and the size (e.g., diameter) of the radiopharmaceutical container and the collimation of the acceptance aperture 120 of the detector 100. According to various aspects, on the basis that the volume of the radiopharmaceutical that is "observable," or detectable, by the sensor 100 is constant from measurement to measurement, the concentration and activity of the radionuclide can be determined, after calibration.

Figure 3:
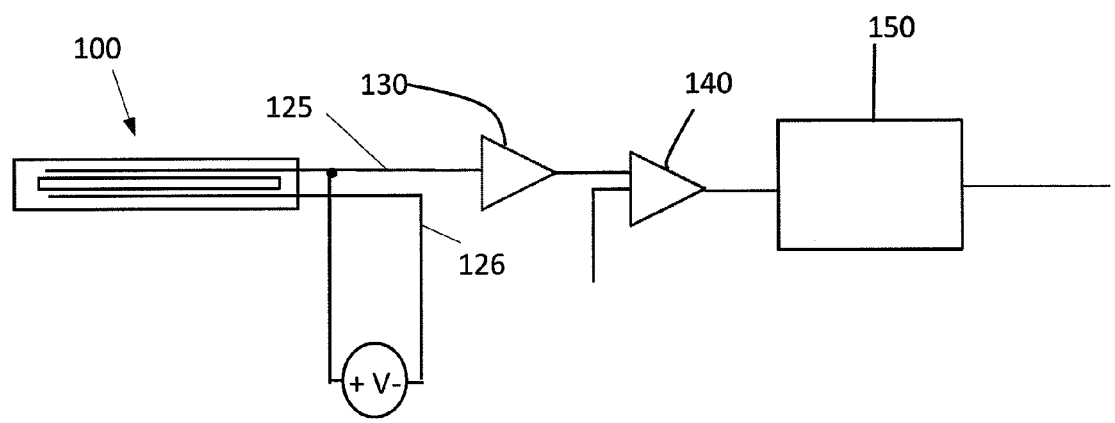
FIG. 3 is a conceptual circuit diagram for measuring gamma rays with the detector of FIGS. 1 and 2, in accordance with various aspects of the invention.

FIG. 3 shows a conceptual circuit diagram for measuring gamma rays with the detector 100. According to various aspects, a charge amplifier 130 coupled to the electrodes 115 and 116 amplifies the charge. According to various aspects, a pulse generator 140 converts the sensed charge to a pulse, where the pulse height is proportional to the energy of the gamma ray. A counting circuit 150 may determine the number of pulses as a function of energy.

Figure 4:
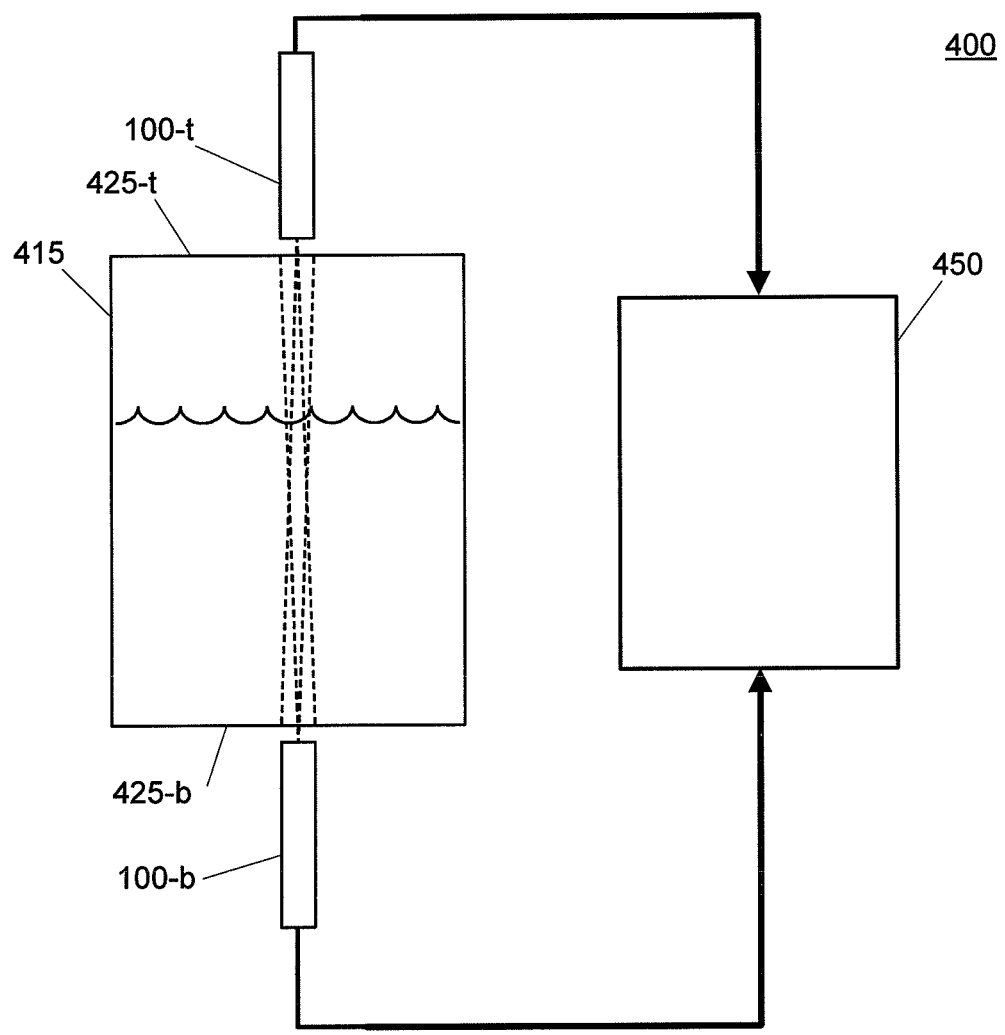
FIG. 4 is a conceptual illustration of an apparatus for measuring concentration, activity and content volume of a radiopharmaceutical using the detector and circuitry of FIGS. 1-3 in accordance with various aspects of the invention.

FIG. 4 is a conceptual illustration of an apparatus 400 for measuring concentration, activity and content volume in a container 415 containing a radionuclide such as F-18 in solution, or a radiopharmaceutical such as F-18 in FDG, using the detector 100 and circuitry of FIGS. 1-3. According to various aspects, the container 415 may have known dimensions, and therefore is known to be able to hold a specified maximum volume of the radionuclide in a liquid form. In operation, according to various aspects, a first detector 100-b may be located opposite a bottom face 425-b of the container 415. Similarly, according to various aspects, a second detector 100-t may be located opposite a top face 425-t of the container, and is similarly configured to detect gamma radiation from the container 415. According to various aspects, the two detectors 100-b, 100-t may be similar or substantially the same. According to various aspects, the two detectors may be identical. Both of the detectors 100-t and 100-b is coupled to a differential measurement processing system 450, shown in greater detail in FIG. 5.

Figure 5:
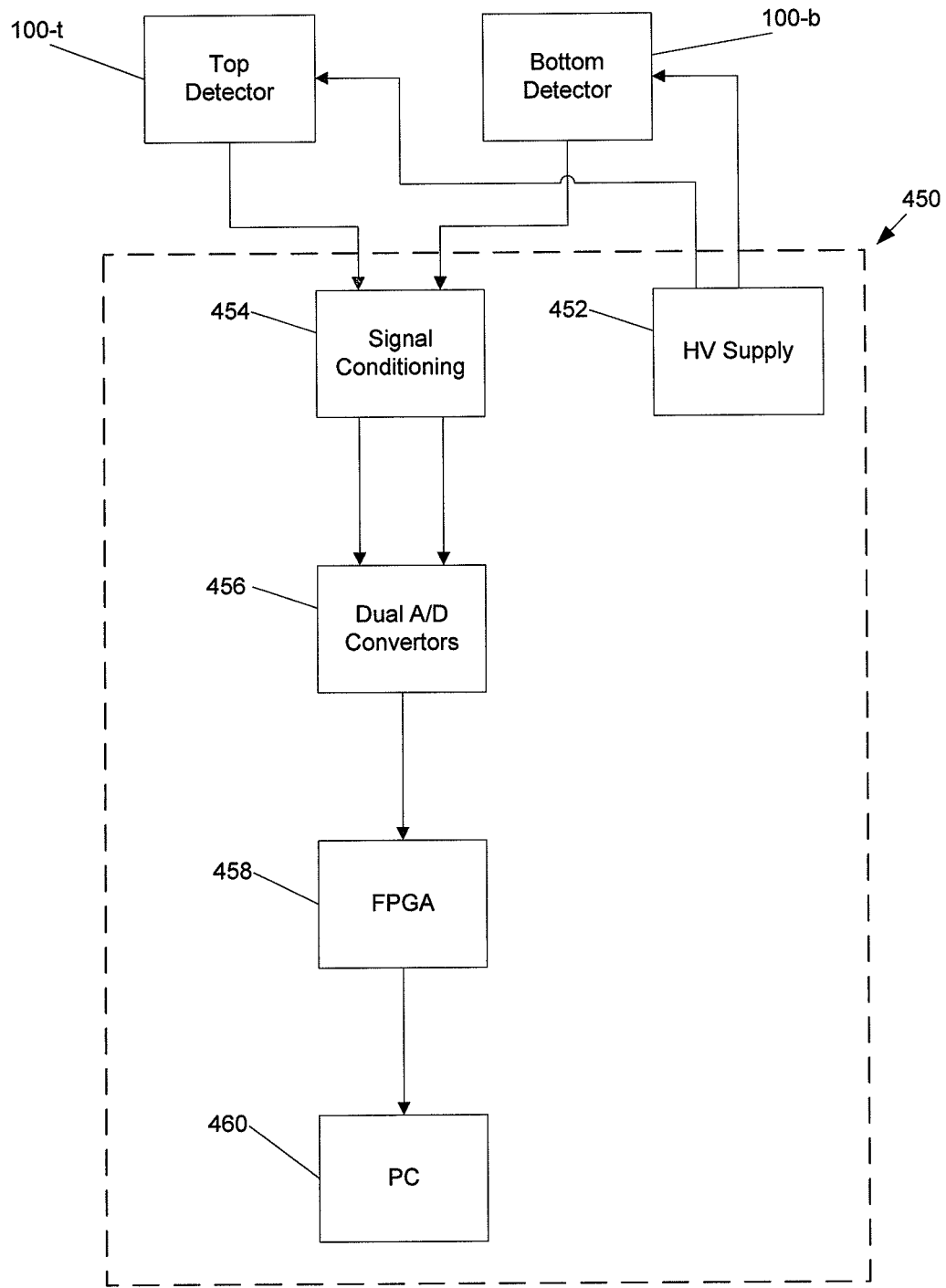
FIG. 5 presents a conceptual processing system for measuring the content volume of the radiopharmaceutical in the apparatus of FIG. 4, in accordance with various aspects of the invention.

FIG. 5 is a block diagram describing the differential processing system 450 coupled to the two detectors, 100-t, 100-b, according to various aspects. The processing system 450 may include a high voltage supply 452 to provide the bias voltage that operates each of the detectors 100-t, 100-b. Charge output from the detectors 100-t and 100-b are separately input (optionally) to signal conditioning circuitry 452 if noise filtering or DC offset correction, or other artifact removal is warranted. Alternatively, the signals from the detectors 100-t, 100-b may be directly input to a dual channel analog-to-digital converter (ADC) 456 for processing in digital format by a customized chip, such as a flexible programmable gate array (FPGA) 458. The function of the FPGA 458 will be discussed further below. Output of the FPGA 458 includes at least computed values for the activity sensed by each of the detectors 100-t, 100-b and the volume of radionuclide in liquid accumulated in the container 415. The output of the FPGA 458 may be communicated to a computing platform, such as a personal computer (PC) 460, or other computing controller for purposes of controlling such processes as filling or emptying the container 415 and identifying parameters associated with the pharmaceutical content for documentation (e.g., date, activity, volume content, labeling, etc.).

The processing system 450 may be distributed across a network to facilitate, for example, efficient use of computing resources to serve a plurality of detectors 100 and containers 415. The division of the processing system 450 across the network may be selected at any of several points. For example, one or more access nodes (not shown) and network links (not shown) may be placed between the dual channel analog-to-digital converter (ADC) 456 and the FPGA 458, in which case the FPGA 458 and the computing platform PC 460 may be remotely located across the network. Alternatively, the access nodes and network links may be located between the FPGA 458 and the PC 460. It should be understood that other network linking arrangements between the detectors 100 and computing and control resources may be configured. The PC 460 may also be a network configured computing resource, which may also be distributed across one or more networks. For example, the computing resource PC 460 may include a server, memory, and other accessories, also located remotely from each other across the one or more networks to provide the operational control of the plurality of detectors 100 coupled to respective containers 415.

Figure 6:
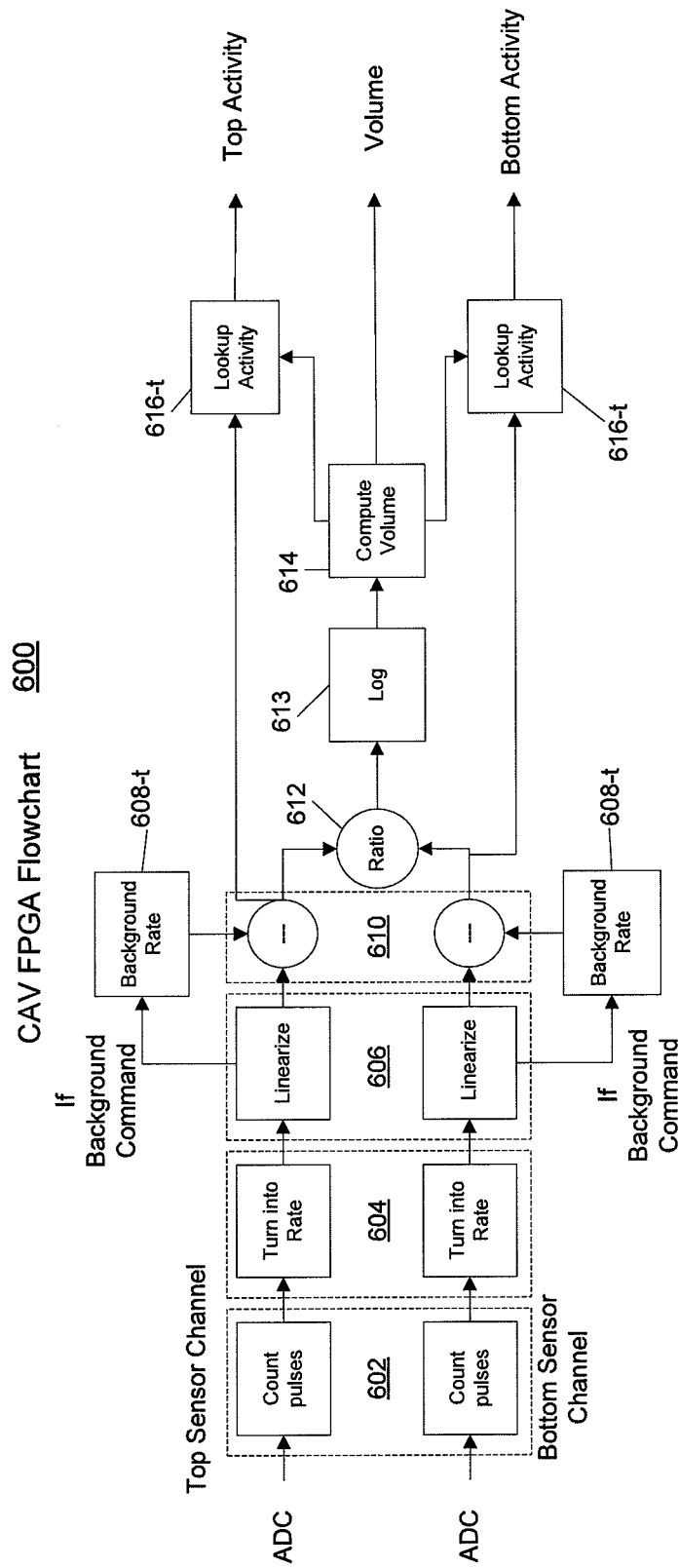
FIG. 6 presents a flowchart of the functions of components of a flexible programmable gate array (FPGA) of the processing system of FIG. 5, in accordance with various aspects of the invention.

FIG. 6 is a flowchart 600 describing the functions of components of the FPGA 458. Digitized data from each channel (i.e., top and bottom) of the ADC 456 is input to respective counters for pulse counting (process block 602). In conjunction with a clocking signal from a timing source (not shown) the pulse counts per unit of time (e.g., seconds) are converted to respective count rates (process block 604).

The count rates are then linearized (in process block 606 for each respective detector 100-t, 100-b). The linearization process may include statistical or calibration-based correction, for example, when the count rate becomes so high that pulses may overlap, an effect referred to as "pile up."

The measured count rate, as counted by the detector and associated electronics, may become lower than the true count rate at high count rates. This is caused by effects in the bias circuitry, crystal, and the electronics. In the bias circuitry and crystal, a high photon flux can cause a shift in the spectral response (as a decreased photopeak to background ratio) which can cause undercounting. Also, the pulse width (governed by the crystal and preamplifier characteristics) along with the pulse counting electronics can have an impact on linearity. At high count rates, pulses can pile up and double or triple pulses may be combined and counted as one instead of two or three separate pulses respectively. This is exacerbated when the pulse width is increased or the counting electronics is too slow to count fast pulse rates (long retrigger times, etc.).

To linearize the count rate, a nonlinearity calibration is performed, along with implementing a look-up table or nonlinearity correction equation. To perform calibration, a high activity sample (e.g., having a maximum expected activity) is placed in front of each sensor and allowed to decay. Data is then collected over several half-lives until the count rate is low (i.e., in the linear range where no pulse pile up occurs). Curve fitting is then performed (e.g., polynomial, Lambert-W, etc.) to describe the relationship between true count rate and the measured count rate. Once established, the curve for each sensor (detector and electronics) can be used in a look-up table or equation-based correction to linearize measurements made.

Accordingly, a correction may be applied on a calibration basis to correct for an undercounting of pulses due to pulse overlap. If a background count has been detected (such as, for example, before the container is filled), a command may be issued for each detector rate to read the background rate (in process blocks 608-t, 608-b, whether from a look-up table, a previous reading from the detectors prior to filling the container, etc.). The background rates are subtracted (in process blocks 610-t and 610-b) from the respective linearized count rates.

The ratio of the resulting "adjusted" counting rates is computed (in process block 612) and the logarithm of the ratio is computed (in process block 613) which, as it happens is approximately linear in proportion to the fill level of the container 415. In one embodiment, the log ratio measurement may be referred to a lookup table to compute the fill volume of the container (as in process block 614). The fill volume depends on a known value of the shape, cross-section and height of the container 415. The adjusted count rate for each detector is compared with the computed volume to determine the lookup activity (in process blocks 616-t and 616-b) for each respective detector 100-t, 100-b. The outputs to the PC 460 include the top activity level, bottom activity level, and container volume.

Figure 7:
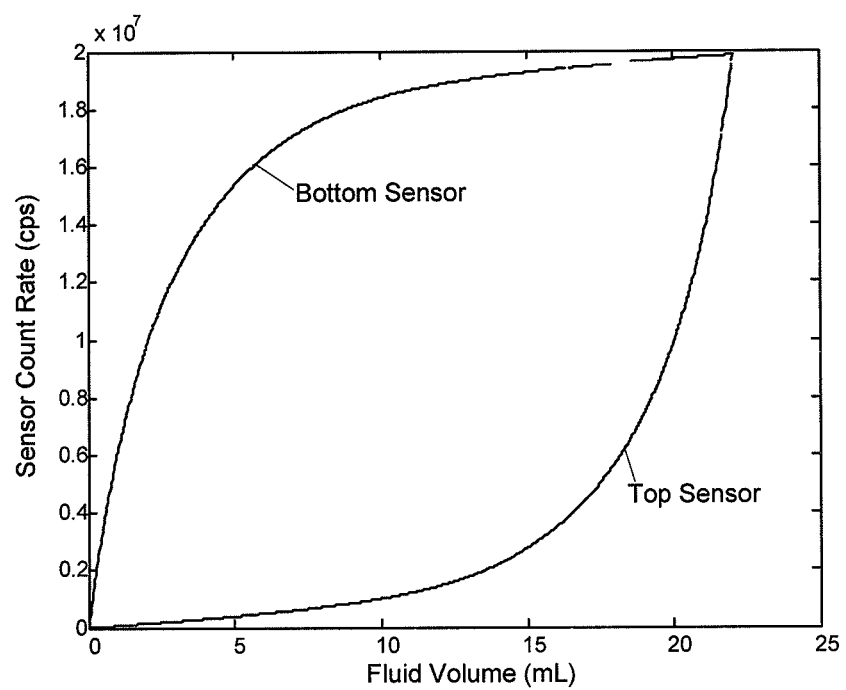
FIG. 7 is a plot of gamma ray activity in counts per second (cps) of a top detector and a bottom detector of the apparatus in FIG. 3 as a container between the two detectors is filled, in accordance with various aspects of the invention.
Figure 8:
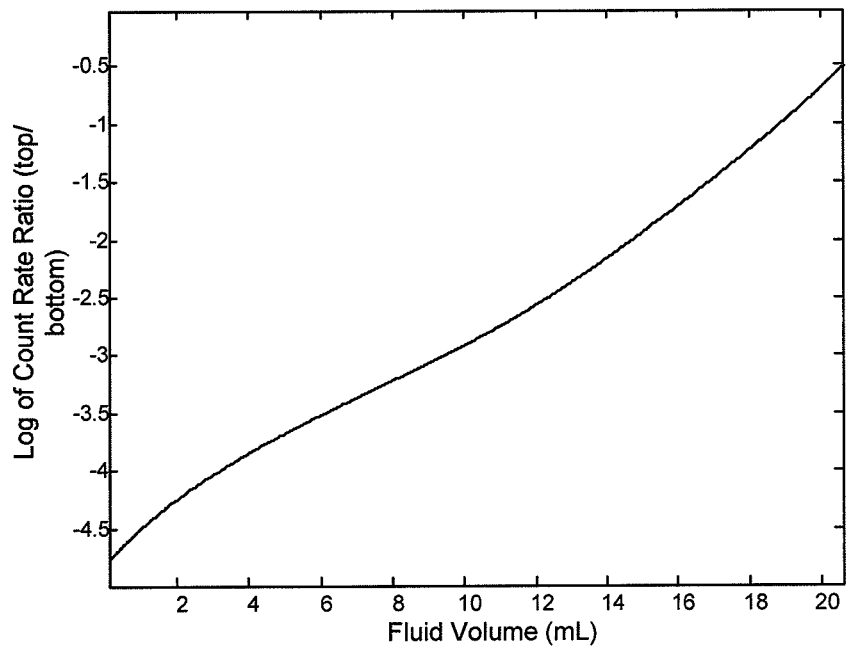
FIG. 8 is a logarithmic plot of the ratio of counts in the top detector to the bottom detector as a function of fill level in the container of the apparatus of FIG. 3, in accordance with various aspects of the invention.

FIG. 7 is a plot of gamma ray activity in counts per second (cps) of the top detector 425-t and the bottom detector 425-b of the apparatus in FIG. 3 as a container between the two detectors is filled, according to various aspects. Because the two detectors 425-t and 425-b may be placed opposite each other, they both interrogate substantially a same volume element. When the container 430 is nearly empty, both detectors register substantially zero counts, apart from background counts, however the ratio asymptotically approaches zero, and the logarithmic ratio becomes large negative. When the container 430 is full, both detectors 425-t, 425-b interrogate substantially the same volume, and therefore register equal counts. Therefore, the ratio between the counts of both detectors 425-t and 425-b is equal to one, and the logarithmic value of the ratio is thus 0. According to various aspects, FIG. 8 is a logarithmic plot of the ratio of counts of the top detector 425-t to the counts of the bottom detector 425-b as a function of fill level in the container 430 of the apparatus 400. For intermediate levels of fill, the log ratio is approximately linear, and the linearized logarithmic measure of the count ratio may be used to determine the fill volume of the entire container, because it may be assumed that the dimensions and shape of the container 430 is defined (e.g., a cylinder of known constant cross-section area and height). With the fill volume and activity thus determined, the concentration of the radionuclide can be determined.

Figure 9:
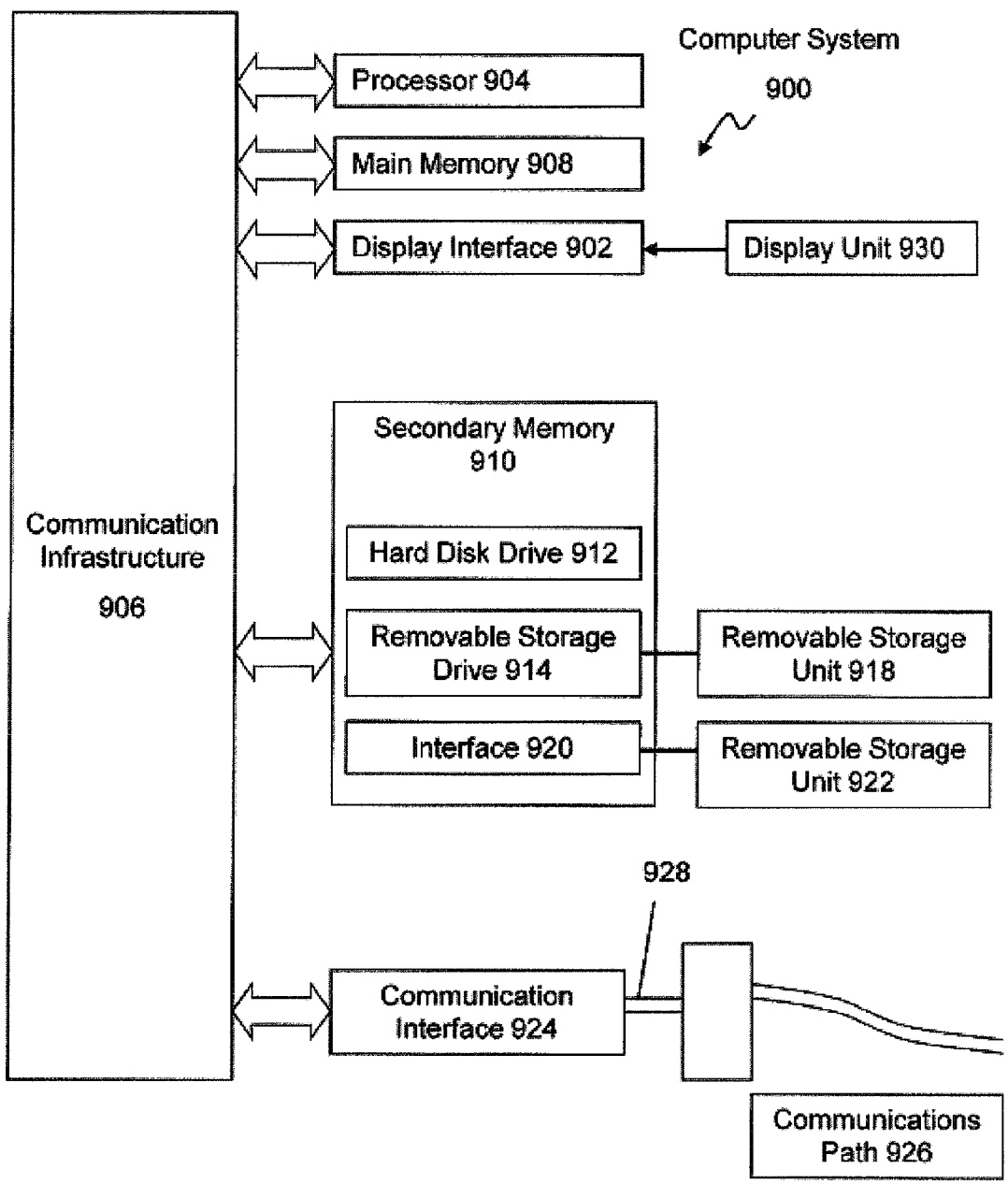
FIG. 9 presents an exemplary system diagram of various hardware components and other features, for use in networking the apparatus for measuring concentration, activity and content volume, in accordance with various aspects of the invention.

According to various aspects, FIG. 9 presents an exemplary system diagram of various hardware components and other features, for use in networking the apparatus for measuring concentration, activity and content volume, in accordance with an aspect of the present invention. Computer system 900 may include a communications interface 924. Communications interface 924 allows software and data to be transferred between computer system 900 and external devices. Examples of communications interface 924 may include a modem, a network interface (such as an Ethernet card), a communications port, a Personal Computer Memory Card International Association (PCMCIA) slot and card, etc. Software and data transferred via communications interface 924 are in the form of signals 928, which may be electronic, electromagnetic, optical or other signals capable of being received by communications interface 924. These signals 928 are provided to communications interface 924 via a communications path (e.g., channel) 926. This path 926 carries signals 928 and may be implemented using wire or cable, fiber optics, a telephone line, a cellular link, a radio frequency (RF) link and/or other communications channels. In this document, the terms "computer program medium" and "computer usable medium" are used to refer generally to media such as a removable storage drive 980, a hard disk installed in hard disk drive 970, and signals 928. These computer program products provide software to the computer system 900. The invention is directed to such computer program products.

Computer programs (also referred to as computer control logic) are stored in main memory 908 and/or secondary memory 910. Computer programs may also be received via communications interface 924. Such computer programs, when executed, enable the computer system 900 to perform the features of the present invention, as discussed herein. In particular, the computer programs, when executed, enable the processor 910 to perform the features of the present invention. Accordingly, such computer programs represent controllers of the computer system 900.

In an aspect where the invention is implemented using software, the software may be stored in a computer program product and loaded into computer system 900 using removable storage drive 914, hard drive 912, or communications interface 920. The control logic (software), when executed by the processor 904, causes the processor 904 to perform the functions of the invention as described herein. In another aspect, the invention is implemented primarily in hardware using, for example, hardware components, such as application specific integrated circuits (ASICs). Implementation of the hardware state machine so as to perform the functions described herein will be apparent to persons skilled in the relevant art(s).

In yet another aspect, the invention is implemented using a combination of both hardware and software.

Figure 10:
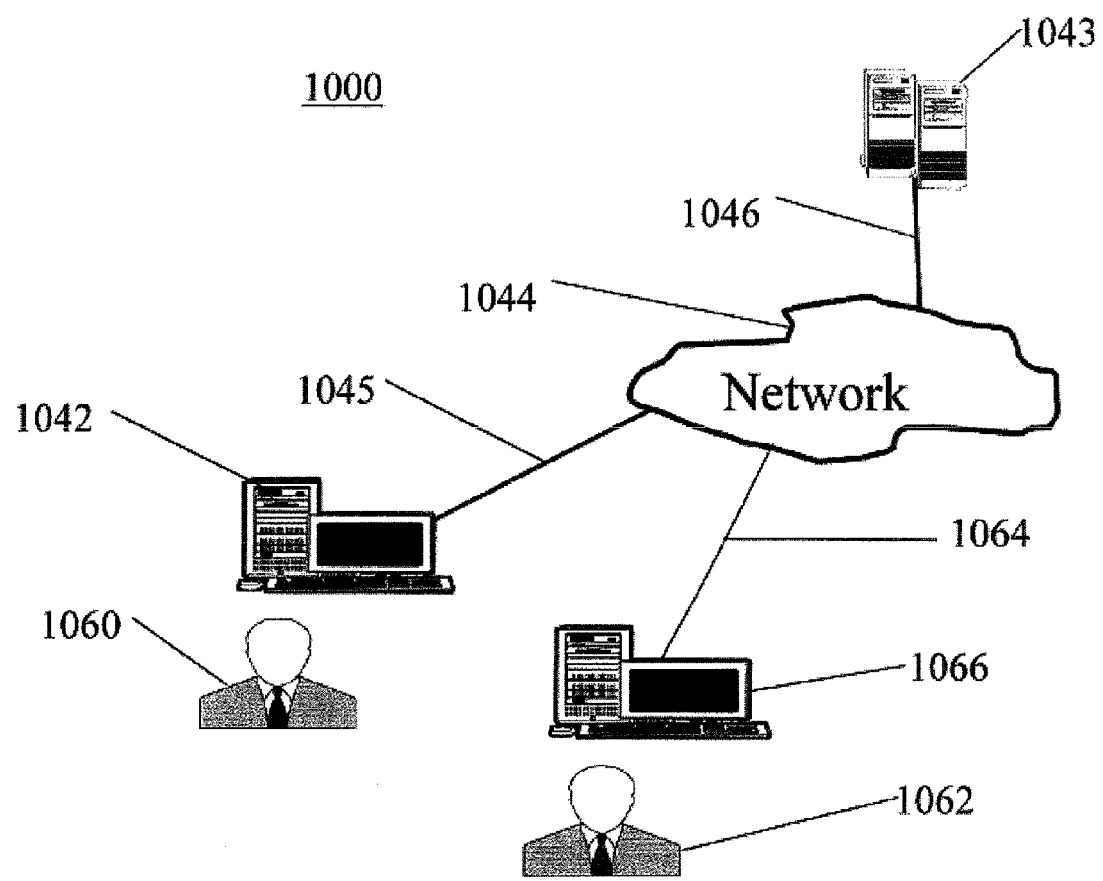
FIG. 10 is a block diagram of various exemplary system components for providing communications with and between various components of the apparatus for measuring concentration, activity and content volume, in accordance with various aspects of the invention.

FIG. 10 is a block diagram of various exemplary system components for providing communications with and between various components of the apparatus for measuring concentration, activity and content volume, in accordance with an aspect of the present invention. FIG. 10 shows a communication system 1000 usable in accordance with the present invention. The communication system 1000 includes one or more accessors 1060, 1062 (also referred to interchangeably herein as one or more "users") and one or more terminals 1042, 1066. In one aspect, data for use in accordance with the present invention is, for example, input and/or accessed by accessors 1060, 1064 via terminals 1042, 1066, such as personal computers (PCs), minicomputers, mainframe computers, microcomputers, telephonic devices, or wireless devices, such as personal digital assistants ("PDAs") or a hand-held wireless devices coupled to a server 1043, such as a PC, minicomputer, mainframe computer, microcomputer, or other device having a processor and a repository for data and/or connection to a repository for data, via, for example, a network 1044, such as the Internet or an intranet, and couplings 1045, 1046, 1064. The couplings 1045, 1046, 1064 include, for example, wired, wireless, or fiber optic links. In another aspect, the method and system of the present invention operate in a stand-alone environment, such as on a single terminal.

The previous description is provided to enable any person skilled in the art to fully understand the full scope of the disclosure. Modifications to the various configurations disclosed herein will be readily apparent to those skilled in the art. Thus, the claims are not intended to be limited to the various aspects of the disclosure described herein, but is to be accorded the full scope consistent with the language of claims, wherein reference to an element in the singular is not intended to mean "one and only one" unless specifically so stated, but rather "one or more." Unless specifically stated otherwise, the term "some" refers to one or more. A claim that recites at least one of a combination of elements (e.g., "at least one of A, B, or C") refers to one or more of the recited elements (e.g., A, or B, or C, or any combination thereof). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

While aspects of this invention have been described in conjunction with the example features outlined above, various alternatives, modifications, variations, improvements, and/or substantial equivalents, whether known or that are or may be presently unforeseen, may become apparent to those having at least ordinary skill in the art. Accordingly, the example aspects of the invention, as set forth above, are intended to be illustrative, not limiting. Various changes may be made without departing from the spirit and thereof. Therefore, aspects of the invention are intended to embrace all known or later-developed alternatives, modifications, variations, improvements, and/or substantial equivalents.

What is claimed is:

1. An apparatus for detecting radioactivity of a sample in a container of known dimensions comprising:
   a first gamma ray detector arranged below a lower surface of the container with respect to gravity; and
   a second gamma ray detector arranged above an upper surface of the container with respect to gravity, opposite the first gamma ray detector;
   wherein each of the first gamma ray detector and the second gamma ray detector have enhanced sensitivity along their respective longitudinal axes;
   wherein each of the first gamma ray detector and the second gamma ray detector detect radioactivity from the sample in the container; and
   a processor configured to determine one or more of a volume of the sample and a concentration of a radionuclide in the sample based on at least the volume of the container, the radioactivity detected by the first gamma ray detector and the radioactivity detected by the second gamma ray detector.

2. The apparatus of claim 1, wherein the first gamma ray detector and the second gamma ray detector comprise cadmium zinc telluride (CZT).

3. The apparatus of claim 1, wherein:
   each of the first gamma ray detector and the second gamma ray detector is elongated along a longitudinal axis;
   each of the first gamma ray detector and the second gamma ray detector is enclosed in a shield having an aperture adjacent a longitudinal end of the respective gamma ray detector; and
   wherein the first gamma ray detector and the second gamma ray detector are configured to detect gamma rays passing through the respective aperture in a direction substantially parallel to the longitudinal axis.

4. The apparatus of claim 1, wherein a logarithm of a ratio of the radioactivity detected by the second gamma ray detector to the radioactivity detected by the first gamma ray detector is substantially linear in proportion to a volume of the sample present in the container.

5. The apparatus of claim 1, wherein the radioactivity detected by the first gamma ray detector is equal to the radioactivity detected by the second gamma ray detector when the container is full.

6. A method of detecting radioactivity of a sample present in a container, comprising:
   providing a first gamma ray detector below a lower surface of the container and a second gamma ray detector above an upper surface of the container opposite the first gamma ray detector;
   detecting a radioactivity level of the sample present in the container via both the first gamma ray detector and the second gamma ray detector; and
   determining one or more of a volume of the sample and a concentration of a radionuclide in the sample based on at least the volume of the container, the radioactivity level detected by the first gamma ray detector and the radioactivity level detected by the second gamma ray detector.

7. The method of claim 6, wherein the first gamma ray detector and the second gamma ray detector comprise cadmium zinc telluride (CZT).

8. The method of claim 6, wherein the step of determining one or more of a volume of the sample and a concentration of a radionuclide in the sample uses a logarithm of a ratio of the radioactivity level detected by the second gamma ray detector to the radioactivity level detected by the first gamma ray detector.

9. An apparatus for detecting radioactivity of a sample in a container of known dimensions comprising:
   a container;
   a first gamma ray detector arranged below a lower surface of the container with respect to gravity; and a second gamma ray detector arranged above an upper surface of the container with respect to gravity, opposite the first gamma ray detector;

wherein each of the first gamma ray detector and the second gamma ray detector detect radioactivity from the sample in the container; and a processor configured to determine one or more of a volume of the sample and a concentration of a radionuclide in the sample based on at least the volume of the container, the radioactivity detected by the first gamma ray detector and the radioactivity detected by the second gamma ray detector.

10. The apparatus of claim 9, wherein a logarithm of a ratio of the radioactivity level detected by the second gamma ray detector to the radioactivity level detected by the first gamma ray detector is substantially linear in proportion to a volume of the sample present in the container.

11. The apparatus of claim 9, wherein the radioactivity level detected by the first gamma ray detector is equal to the radioactivity level detected by the second gamma ray detector when the container is full.

* * * * *